US012813163B2

(12) United States Patent
Sasaki

(10) Patent No.: US 12,813,163 B2
(45) Date of Patent: Nov. 24, 2026

(54) MAGNETIZATION ROTATING ELEMENT, MAGNETORESISTIVE EFFECT ELEMENT, AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 155 days.

(21) Appl. No.: 18/838,824

(22) PCT Filed: Mar. 7, 2022

(86) PCT No.: PCT/JP2022/009710
§ 371 (c)(1),
(2) Date: Aug. 15, 2024

(87) PCT Pub. No.: WO2023/170738
PCT Pub. Date: Sep. 14, 2023

(65) Prior Publication Data

US 2025/0204263 A1 Jun. 19, 2025

(51) Int. Cl.
*H10N 50/10* (2023.01)
*G11C 11/16* (2006.01)
*H10N 50/85* (2023.01)

(52) U.S. Cl.
CPC ........... *H10N 50/10* (2023.02); *G11C 11/161* (2013.01); *H10N 50/85* (2023.02); *G11C 11/1673* (2013.01); *G11C 11/1675* (2013.01)

(58) Field of Classification Search
CPC ......................... G11C 11/161; G11C 11/1673; G11C 11/1675
See application file for complete search history.

(56) References Cited

U.S. PATENT DOCUMENTS 11,610,614 B2 * 3/2023 Saito ........................ G11C 11/18
2009/0117271 A1 5/2009 Harada
2016/0064654 A1 3/2016 Tonegawa et al.
2024/0145147 A1 5/2024 Ieda et al.
2024/0365678 A1 * 10/2024 Kim ....................... H10B 61/00

FOREIGN PATENT DOCUMENTS

JP H04-152507 A 5/1992
JP H06-112047 A 4/1994
JP 2016-046492 A 4/2016
JP 2017-216286 A 12/2017
JP 2022-131304 A 9/2022
JP 7287593 B1 6/2023
WO 2007/123102 A1 11/2007
WO 2022/181069 A1 9/2022

OTHER PUBLICATIONS

May 31, 2022 International Search Report issued in International Patent Application No. PCT/JP2022/009710.
Yuta Yamane et al. "Theory of Emergent Inductance With Spin-Orbit Coupling Effects". Physical Review Letters, 2022, vol. 128, pp. 147201-1-147201-6.
Yasufumi Araki et al. "Emergence of Inductance and Capacitance From Topological Electromagnetism". Journal of the Physical Society of Japan, 2023, vol. 92, pp. 074705-1-074705-9.

* cited by examiner

*Primary Examiner* — Han Yang
(74) *Attorney, Agent, or Firm* — Oliff PLC

(57) ABSTRACT

This magnetization rotating element includes a spin-orbit torque wiring and a first ferromagnetic layer connected to the spin-orbit torque wiring, wherein the spin-orbit torque wiring has an amorphous structure, and the amorphous structure is made of any of an oxide, a nitride, and an oxynitride.

14 Claims, 7 Drawing Sheets

MAGNETIZATION ROTATING ELEMENT, MAGNETORESISTIVE EFFECT ELEMENT, AND MAGNETIC MEMORY

TECHNICAL FIELD

The present disclosure relates to a magnetization rotating element, a magnetoresistive effect element, and a magnetic memory.

BACKGROUND ART

Giant magnetoresistive (GMR) elements each including a multilayer film of a ferromagnetic layer and a nonmagnetic layer, and tunnel magnetoresistive (TMR) elements each using an insulation layer (a tunnel barrier layer or a barrier layer) as a nonmagnetic layer are known as magnetoresistive effect elements. Magnetoresistive effect elements can be applied to magnetic sensors, high frequency components, magnetic heads, and nonvolatile random access memories (MRAMs).

An MRAM is a memory element in which magnetoresistive effect elements are integrated. An MRAM reads and writes data using the characteristic that a resistance of a magnetoresistive effect element changes when mutual magnetization directions of two ferromagnetic layers between which a nonmagnetic layer is interposed in the magnetoresistive effect element changes. A magnetization direction of a ferromagnetic layer is controlled using, for example, a magnetic field generated by an electric current. For example, a magnetization direction of a ferromagnetic layer is controlled using a spin transfer torque (STT) generated by passing an electric current in a lamination direction of a magnetoresistive effect element.

In the case of rewriting the magnetization direction of the ferromagnetic layer using the STT, an electric current flows in the lamination direction of the magnetoresistive effect element. A write current causes characteristic deterioration of a magnetoresistive effect element.

In recent years, attention has been focused on a method in which an electric current is not required to flow in a lamination direction of a magnetoresistive effect element at the time of writing (for example, Patent Document 1). One such method is a writing method using a spin-orbit torque (SOT). An SOT is induced by a spin current caused by spin-orbit interaction or by the Rashba effect at an interface between dissimilar materials. An electric current for inducing an SOT in a magnetoresistive effect element flows in a direction intersecting a lamination direction of a magnetoresistive effect element. That is, there is no need to flow an electric current in a lamination direction of a magnetoresistive effect element, and thus a longer life of a magnetoresistive effect element is expected.

CITATION LIST

Patent Document

Patent Document 1

Japanese Unexamined Patent Application, First Publication No. 2017-216286

SUMMARY OF INVENTION

Technical Problem

A magnetic memory has a plurality of integrated magnetoresistive effect elements. When an amount of electric current applied to each magnetoresistive effect element increases, power consumption of the magnetic memory increases. It is required to reduce the amount of electric current applied to each magnetoresistive effect element and inhibit the power consumption of the magnetic memory.

The present disclosure has been made in consideration of these circumstances, and an object thereof is to provide a magnetization rotating element, a magnetoresistive effect element, and a magnetic memory that can operate with a small electric current.

Solution to Problem

In order to solve the above problems, the present disclosure provides the following means.

(1) A magnetization rotating element according to a first aspect includes a spin-orbit torque wiring and a first ferromagnetic layer connected to the spin-orbit torque wiring. The spin-orbit torque wiring has an amorphous structure. The amorphous structure is made of any of an oxide, a nitride, and an oxynitride.

(2) In the magnetization rotating element according to the above aspect, a concentration of oxygen or nitrogen contained in the spin-orbit torque wiring may be lower than a concentration of oxygen or nitrogen of a stoichiometric composition determined from cations contained in the spin-orbit torque wiring.

(3) In the magnetization rotating element according to the above aspect, the spin-orbit torque wiring may include an element including d electrons or f electrons.

(4) In the magnetization rotating element according to the above aspect, a concentration of oxygen or nitrogen in a first surface of the spin-orbit torque wiring on a side closer to the first ferromagnetic layer may be different from a concentration of oxygen or nitrogen in a second surface on a side opposite to the first surface.

(5) In the magnetization rotating element according to the above aspect, the concentration of oxygen or nitrogen in the second surface may be higher than the concentration of oxygen or nitrogen in the first surface.

(6) In the magnetization rotating element according to the above aspect, the concentration of oxygen or nitrogen may gradually decrease from the second surface toward the first surface.

(7) In the magnetization rotating element according to the above aspect, the concentration of oxygen or nitrogen may be maximum or minimum between the second surface and the first surface.

(8) In the magnetization rotating element according to the above aspect, the concentration of oxygen or nitrogen in the spin-orbit torque wiring may differ between a center and a side in any in-plane direction.

(9) The magnetization rotating element according to the above aspect may further include a first insulation layer that covers side surfaces of the first ferromagnetic layer and the spin-orbit torque wiring. The first insulation layer is made of any of an oxide, a nitride, and an oxynitride.

(10) The magnetization rotating element according to the above aspect may further include a second insulation layer that covers a second surface of the spin-orbit torque wiring on a side opposite to a first surface closer to the first ferromagnetic layer. The second insulation layer is made of any of an oxide, a nitride, and an oxynitride.

(11) In the magnetization rotating element according to the above aspect, the second insulation layer may include a metal element included in the spin-orbit torque wiring.

(12) In the magnetization rotating element according to the above aspect, the spin-orbit torque wiring may include a crystallized layer inside.

(13) In the magnetization rotating element according to the above aspect, the crystallized layer may contain any one selected from the group consisting of Ta, Al, Mg, Si, Ga, and Ge.

(14) A magnetoresistive effect element according to a second aspect includes the magnetization rotating element according to the above aspect, a second ferromagnetic layer, and a nonmagnetic layer. The nonmagnetic layer is interposed between the first ferromagnetic layer and the second ferromagnetic layer.

(15) A magnetic memory according to a third aspect includes a plurality of magnetoresistive effect elements according to the above aspect.

Advantageous Effects of Invention

The magnetization rotating element, the magnetoresistive effect element, and the magnetic memory according to the present disclosure operate with a small current.

DESCRIPTION OF EMBODIMENTS

The present embodiment will be described in detail below with reference to the drawings as appropriate. In the figures used in the following description, in order to make the features easier to understand, featured portions may be shown enlarged for convenience, and dimensional ratios or the like of each constituent element may differ from actual ones. Materials, dimensions, and the like exemplified in the following description are examples, and the present disclosure is not limited thereto and can be implemented with appropriate changes within the scope of achieving the effects of the present disclosure.

First, directions will be defined. One direction of one surface of a substrate Sub (see FIG. 2), which will be described later, is defined as an x direction, and a direction orthogonal to the x direction is defined as a y direction. The x direction is, for example, a longitudinal direction of a spin-orbit torque wiring 20. A z direction is a direction orthogonal to the x direction and the y direction. The z direction is an example of a lamination direction in which layers are laminated. Hereinafter, a +z direction may be expressed as "upward" and a −z direction may be expressed as "downward." Upward and downward do not necessarily correspond to the direction in which gravity is applied.

In the present specification, the expression "extend in the x direction" indicates, for example, that the dimension in the x direction is greater than the smallest dimension among the dimensions in the x direction, the y direction, and the z direction. The same applies to the case of extending in other directions. Further, in the present specification, the term "connection" is not limited to a case of a physical connection. For example, the term "connection" is not limited to a case in which two layers are physically in contact with each other, but also includes a case in which two layers are connected to each other with another layer interposed therebetween. In addition, the term "connection" as used herein includes electrical connection as well.

First Embodiment

Figure 1:
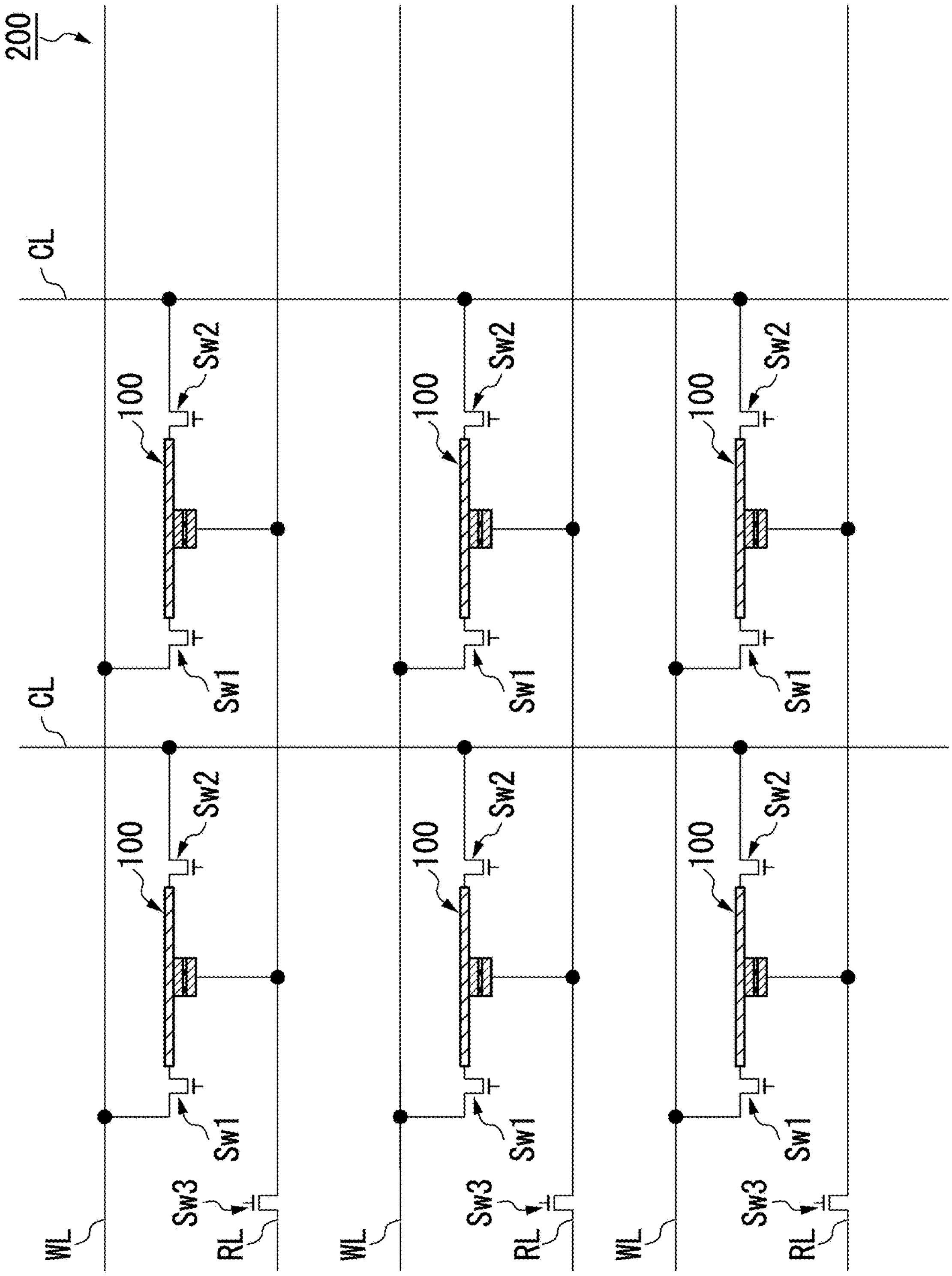
FIG. 1 is a circuit diagram of a magnetic memory according to a first embodiment.

FIG. 1 is a configuration diagram of a magnetic memory 200 according to a first embodiment. The magnetic memory 200 includes a plurality of magnetoresistive effect elements 100, a plurality of write wirings WL, a plurality of common wirings CL, a plurality of read wirings RL, a plurality of first switching elements Sw1, a plurality of second switching elements Sw2, and a plurality of third switching elements Sw3. In the magnetic memory 200, the magnetoresistive effect elements 100 are arranged in a matrix, for example.

Each of the write wirings WL electrically connects a power source to one or more magnetoresistive effect elements 100. Each of the common wirings CL is a wiring used both when writing and reading data. Each of the common wirings CL electrically connects a reference potential to one or more magnetoresistive effect elements 100. The reference potential is, for example, ground. The common wiring CL may be provided for each of the plurality of magnetoresistive effect elements 100 or may be provided for the plurality of magnetoresistive effect elements 100. Each of the read wirings RL electrically connects the power source to one or more magnetoresistive effect elements 100. The power source is connected to the magnetic memory 200 in use.

Each of the magnetoresistive effect elements 100 is connected to the first switching element Sw1, the second switching element Sw2, and the third switching element Sw3. The first switching element Sw1 is connected between the magnetoresistive effect element 100 and the write wiring WL. The second switching element Sw2 is connected between the magnetoresistive effect element 100 and the common wiring CL. The third switching element Sw3 is connected to the read wiring RL provided for a plurality of magnetoresistive effect elements 100.

When predetermined first and second switching elements Sw1 and Sw2 are turned on, a write current flows between the write wiring WL and the common wiring CL that are connected to a predetermined magnetoresistive effect element 100. When the write current flows, data is written into the predetermined magnetoresistive effect element 100. When predetermined second and third switching elements Sw2 and Sw3 are turned on, a read current flows between the common wiring CL and the read wiring RL that are connected to a predetermined magnetoresistive effect element 100. When the read current flows, data is read from the predetermined magnetoresistive effect element 100.

The first switching element Sw1, the second switching element Sw2, and the third switching element Sw3 are elements for controlling a flow of an electric current. The first switching element Sw1, the second switching element Sw2, and the third switching element Sw3 are, for example, transistors, elements that utilize phase changes in crystal layers, such as ovonic threshold switches (OTS), elements that utilize changes in band structure, such as metal-insulator transition (MIT) switches, elements that utilize breakdown voltages, such as Zener diodes and avalanche diodes, or elements whose conductivity changes with changes in atomic positions.

In the magnetic memory 200 shown in FIG. 1, the magnetoresistive effect elements 100 connected to the same read wiring RL share the third switching element Sw3. The third switching element Sw3 may be provided for each of the magnetoresistive effect elements 100. Also, each of the magnetoresistive effect elements 100 is provided with the third switching element Sw3, and the first switching element Sw1 or the second switching element Sw2 may be shared by the magnetoresistive effect elements 100 connected to the same wiring.

Figure 2:
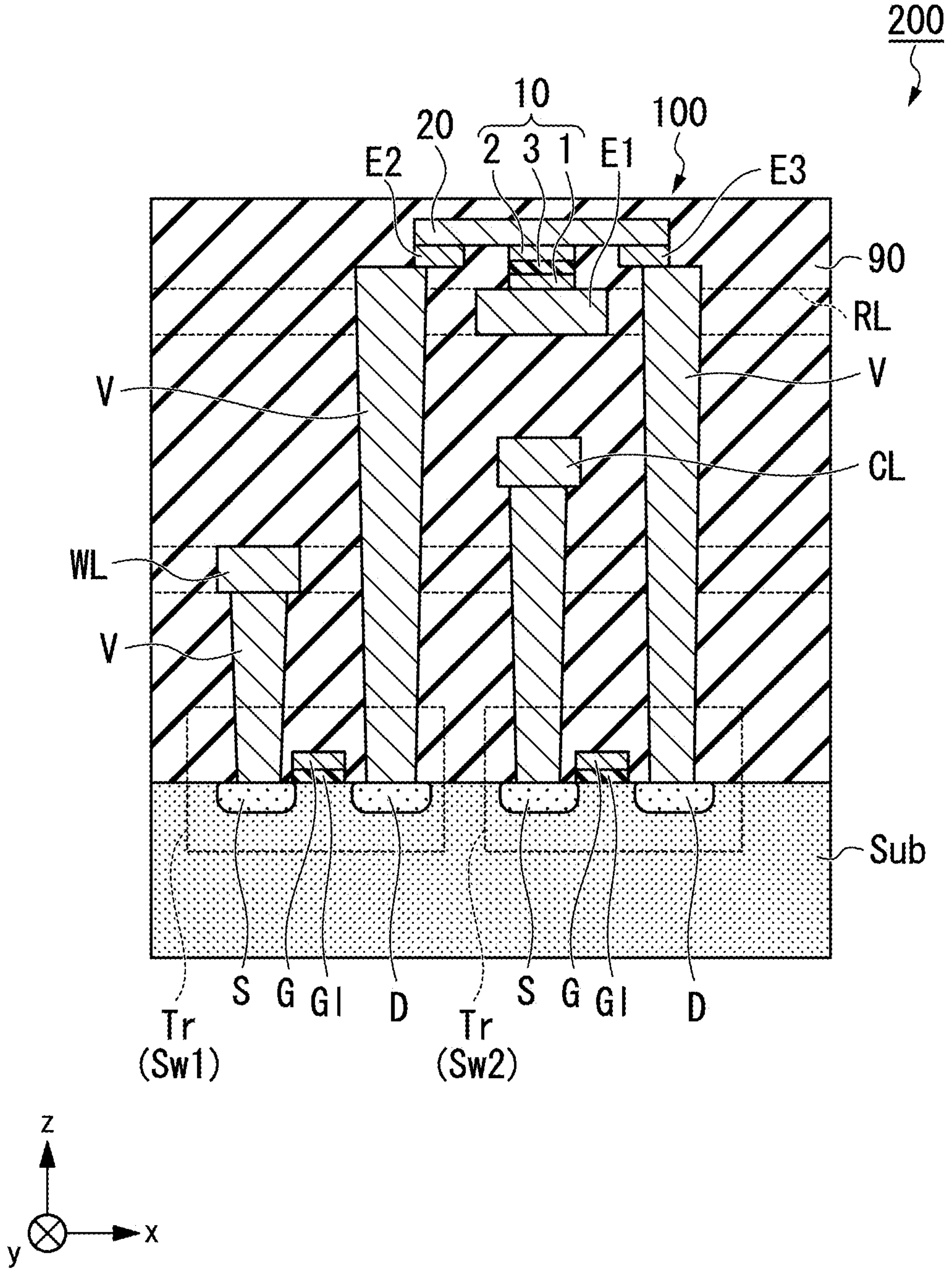
FIG. 2 is a cross-sectional view of a featured portion of the magnetic memory according to the first embodiment.

FIG. 2 is a cross-sectional view of a featured portion of the magnetic memory 200 according to the first embodiment. FIG. 2 is a cross-section of the magnetoresistive effect element 100 along the xz plane passing through a center of a width of the spin-orbit torque wiring 20 in the y direction, which will be described later.

The first switching element Sw1 and the second switching element Sw2 shown in FIG. 2 are transistors Tr. The third switching element Sw3 is electrically connected to the read wiring RL and is located at a different position in the x direction in FIG. 2, for example. The transistors Tr are, for example, field effect transistors and each includes a gate electrode G, a gate insulation film GI, and a source S and a drain D formed on a substrate Sub. The source S and the drain D are defined by a flowing direction of an electric current and are identical regions. A positional relationship between the source S and the drain D may be reversed. The substrate Sub is, for example, a semiconductor substrate.

The transistors Tr and the magnetoresistive effect element 100 are electrically connected to each other via via wirings V and electrodes E2 and E3. In addition, a transistor Tr and the write wiring WL or the common wiring CL are connected to each other via a via wiring V. For example, the via wirings V extend in the z direction. The read wiring RL is connected to a laminate 10 via an electrode E1. The via wirings V and the electrode E1 include conductive materials, A via wiring V and the electrode E2 may be integrated. Also, a via wiring V and the electrode E3 may be integrated. That is, the electrode E2 may be a part of the via wiring V, and the electrode E3 may be a part of a via wiring V.

The magnetoresistive effect element 100 and the transistors Tr are covered with an insulation layer 90. The insulation layer 90 is an insulation layer that insulates between wirings of multilayer wiring and between elements. The insulation layer 90 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), magnesium oxide (MgO), aluminum nitride (AlN), or the like.

Figure 3:
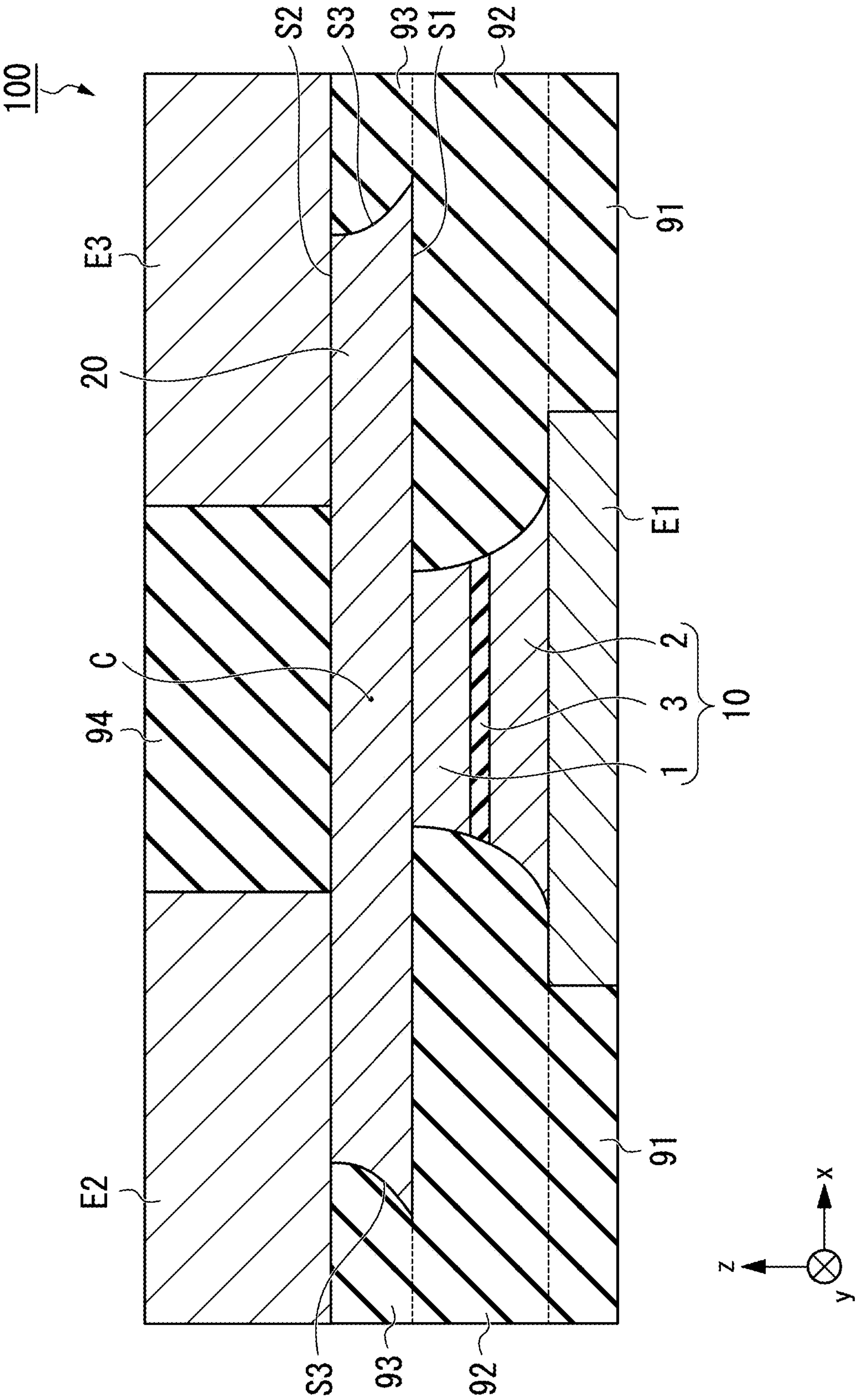
FIG. 3 is a cross-sectional view of a magnetoresistive effect element according to the first embodiment.
Figure 4:
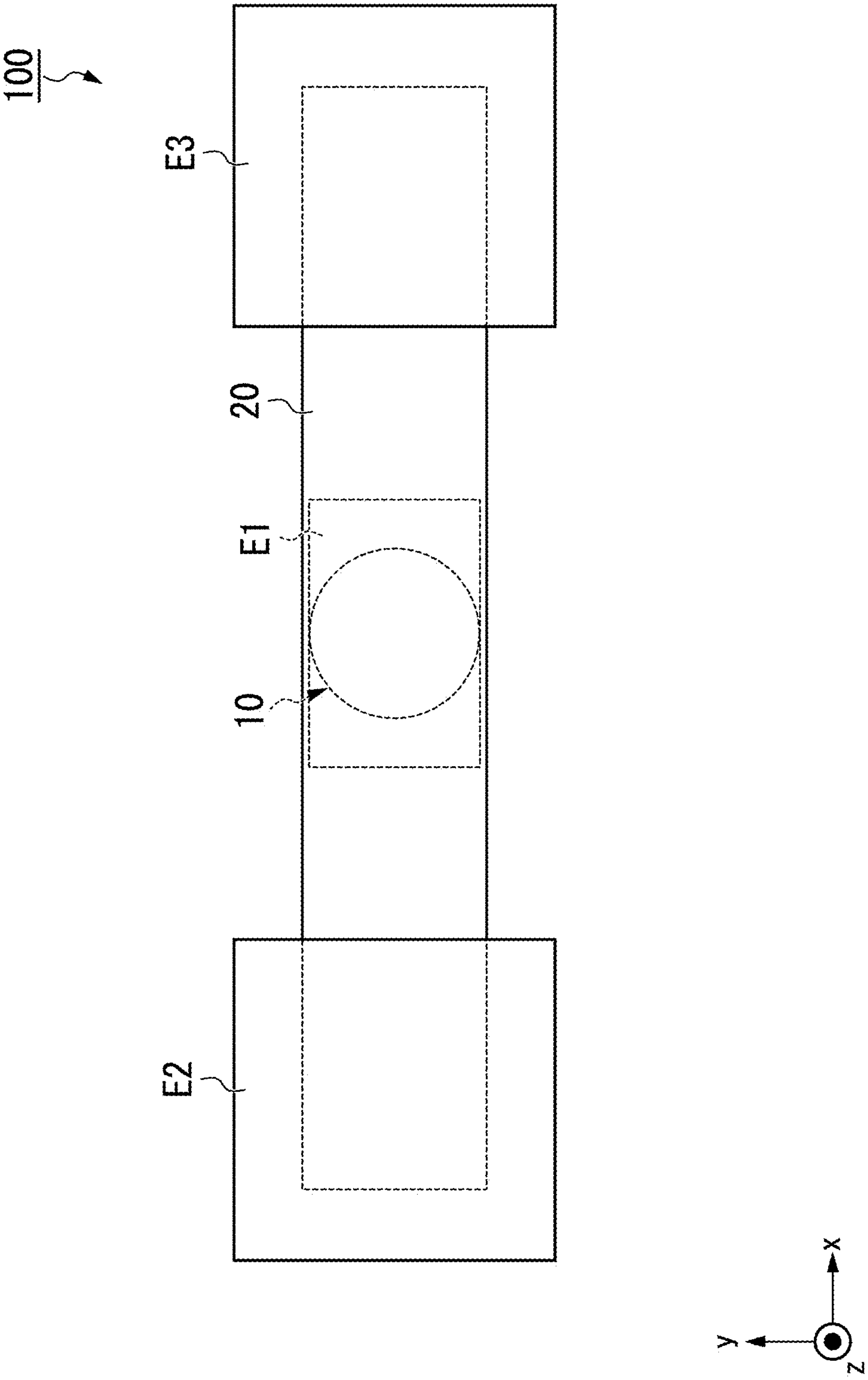
FIG. 4 is a plan view of the magnetoresistive effect element according to the first embodiment.

FIG. 3 is a cross-sectional view of the magnetoresistive effect element 100. FIG. 3 is a cross-section of the magnetoresistive effect element 100 along the xz plane passing through the center of the width of the spin-orbit torque wiring 20 in the y direction. FIG. 4 is a plan view of the magnetoresistive effect element 100 in the z direction.

The magnetoresistive effect element 100 includes, for example, the laminate 10, the spin-orbit torque wiring 20, and the electrodes E1, E2, and E3. The magnetoresistive effect element 100 is covered with, for example, insulation layers 91, 92, 93, and 94. The insulation layers 91, 92, 93, and 94 are parts of the insulation layer 90.

The magnetoresistive effect element 100 is a magnetic element that uses a spin-orbit torque (SOT), and is sometimes referred to as a spin-orbit torque type magnetoresistive effect element, a spin injection type magnetoresistive effect element, or a spin-current magnetoresistive effect element.

The magnetoresistive effect element 100 is an element for recording and storing data. The magnetoresistive effect element 100 records data using a resistance value of the laminate 10 in the z direction. The resistance value of the laminate 10 in the z direction changes when a write current is applied along the spin-orbit torque wiring 20 and spins are injected into the laminate 10 from the spin-orbit torque wiring 20. The resistance value of the laminate 10 in the z direction can be read when a read current is applied to the laminate 10 in the z direction.

For example, the spin-orbit torque wiring 20 has a longer length in the x direction than in the y direction when viewed in the z direction, and extends in the x direction. The write current flows between the electrode E2 and the electrode E3 in the x direction along the spin-orbit torque wiring 20. The spin-orbit torque wiring 20 is connected to each of the electrode E2 and the electrode E3.

The spin-orbit torque wiring 20 generates a spin current by the spin Hall effect when an electric current flows, and injects spins into a first ferromagnetic layer 1. For example, the spin-orbit torque wiring 20 applies an amount of the spin-orbit torque (SOT) which can reverse magnetization of the first ferromagnetic layer 1 to the magnetization of the first ferromagnetic layer 1. The spin Hall effect is a phenomenon in which, when an electric current flows, a spin current is induced in a direction perpendicular to a flowing direction of the electric current on the basis of spin-orbit interaction. The spin Hall effect is similar to a normal Hall effect in that moving (traveling) charges (electrons) can bend a moving (traveling) direction thereof. In the normal Hall effect, a moving direction of charged particles moving in a magnetic field is bent by the Lorentz force. In contrast, in the spin Hall effect, a moving direction of spin is bent simply by movement of electrons (flowing of an electric current) even when there is no magnetic field.

For example, when an electric current flows through the spin-orbit torque wiring 20 in the x direction, a first spin polarized in a −y direction and a second spin polarized in a +y direction are each bent in the z direction by the spin Hall effect. For example, the first spin polarized in the −y direction is bent from the x direction, which is the traveling direction, to the +z direction, and the second spin polarized in the +y direction is bent from the x direction, which is the traveling direction, to the −z direction.

In a nonmagnetic material (a material that is not a ferromagnetic material), the number of first spin electrons and the number of second spin electrons produced by the spin Hall effect are equal. That is, the number of first spin electrons oriented in the +Z direction is equal to the number of second spin electrons oriented in the −z direction. In movement of the first spin and the second spin in the z direction, flows of the charges cancel each other out, and thus an amount of current becomes zero. A spin current without an electric current is particularly called a pure spin current.

When a flow of first spin electrons is expressed as $J_\uparrow$, a flow of second spin electrons is expressed as $J_\downarrow$, and a spin current is expressed as $J_S$, $J_S$ is defined as $J_S=J_\uparrow-J_\downarrow$. The spin current $J_S$ is generated in the z direction. The second spin is injected into the first ferromagnetic layer 1 from the spin-orbit torque wiring 20.

The spin-orbit torque wiring 20 includes an amorphous structure. The spin-orbit torque wiring 20 is made of, for example, an amorphous structure. The amorphous structure is a structure in which constituent atoms do not have a clear crystal structure. When no diffraction spots are confirmed in an electron beam diffraction image of a transmission electron microscope, the material can be considered to have an amorphous structure. Further, in many cases, materials with an amorphous structure do not show clear peaks in X-ray diffraction.

The amorphous structure included in the spin-orbit torque wiring 20 is made of any of an oxide, a nitride, or an oxynitride. The spin-orbit torque wiring 20 is made of, for example, any of a metal oxide, a metal nitride, or a metal oxynitride.

When the spin-orbit torque wiring 20 has an amorphous structure made of any of a metal oxide, a metal nitride, or a metal oxynitride, ionic bonds between metal ions and oxygen or nitrogen ions and covalent bonds between metal elements are present in a mixed state in the spin-orbit torque wiring 20. When different bonding states between atoms are present in a mixed state, the symmetry in the spin-orbit torque wiring 20 is broken. From the perspective of electrons propagating through the spin-orbit torque wiring 20, when the symmetry in the spin-orbit torque wiring 20 is broken, a large spin current is generated in the spin-orbit torque wiring 20. As a result, the spin current injected into the first ferromagnetic layer 1 increases, and a reversal current density required for magnetization reversal of the first ferromagnetic layer 1 can be reduced.

The metal element constituting the metal oxide, the metal nitride, or the metal oxynitride is, for example, a nonmagnetic heavy metal. The nonmagnetic heavy metal has, for example, d electrons or f electrons in the outermost shell. When the spin-orbit torque wiring 20 contains the nonmagnetic heavy metal, strong spin-orbit interaction occurs in the spin-orbit torque wiring 20, and the spin current injected into the first ferromagnetic layer 1 increases.

The metal elements constituting the metal oxide, the metal nitride, or the metal oxynitride are, for example, any one selected from the group consisting of Ti, Cr, Mn, Cu, Mo, Ru, Rh, Hf, Ta, W, Re, Os, Ir, Pt, Au, Pr, Nd, Sm, Eu, Gd, Tb, Dy, and Ho.

The spin-orbit torque wiring 20 is, for example, an oxide represented by the composition formula of $R_2Ir_2O_7$. In the composition formula, R is one or more elements selected from the group consisting of Pr, Nd, Sm, Eu, Gd, Tb, Dy, and Ho.

A concentration of oxygen or nitrogen contained in the spin-orbit torque wiring 20 is, for example, lower than a concentration of oxygen or nitrogen of the stoichiometric composition determined from cations included in the spin-orbit torque wiring 20. For example, when the cations are R and Ir as described above, the stoichiometric composition is $R_2Ir_2O_7$. In this case, the spin-orbit torque wiring 20 may be $R_2Ir_2O_{7-x}$ with oxygen deficiency. Here, an example of an oxide has been shown, but in the case of a nitride, nitrogen deficiency may be present, and in the case of an oxynitride, oxygen deficiency or nitrogen deficiency may be present. When oxygen deficiency or nitrogen deficiency is present, conductive carriers in the spin-orbit torque wiring 20 increase, and the resistance of the spin-orbit torque wiring 20 can be reduced.

A concentration of oxygen or nitrogen of a first surface S1 of the spin-orbit torque wiring 20 may be different from a concentration of oxygen or nitrogen of a second surface S2, for example. When the concentrations of oxygen or nitrogen of the first surface S1 and the second surface S2 are different from each other, the symmetry in the spin-orbit torque wiring 20 can be broken, and the reversal current density required for the magnetization reversal of the first ferromagnetic layer 1 can be reduced. The first surface S1 is a surface of the spin-orbit torque wiring 20 on a side closer to the first ferromagnetic layer 1, The second surface S2 is a surface opposing the first surface S1.

For example, the concentration of oxygen or nitrogen of the second surface S2 may be higher than that of the first surface S1. For example, the concentration of oxygen or nitrogen may gradually decrease from the second surface S2 toward the first surface S1. A portion with a low concentration of oxygen or nitrogen has a large amount of oxygen deficiency or nitrogen deficiency, and a write current is likely to flow therethrough. When an amount of write current flowing near the first surface S1 closer to the first ferromagnetic layer 1 increases, the spins injected into the first ferromagnetic layer 1 increases.

Also, the concentration of oxygen or nitrogen may be maximum or minimum at any position between the second surface S2 and the first surface S1, for example. By making the concentrations of oxygen or nitrogen of the second surface S2 and the first surface S1 different from each other, the symmetry is broken, and a large amount of spin current is generated, which makes it possible to reduce the reversal current. Also, the concentration of oxygen or nitrogen of the first surface S1 may be higher than the concentration of oxygen or nitrogen of the second surface S2, for example. This increases the resistance of the first surface S1 of the spin-orbit torque wiring 20 due to oxygen or nitrogen, resulting in a high spin resistance, Due to the increased spin resistance, the amount of spin current injected into the first ferromagnetic layer 1 returning to the spin-orbit torque wiring 20 can be curbed, and the injected spin current can efficiently facilitate occurrence of the magnetization reversal of the first ferromagnetic layer 1.

Also, the concentration of oxygen or nitrogen of the spin-orbit torque wiring 20 may differ between a center C and a side surface S3 in any in-plane direction. For example, the concentration of oxygen or nitrogen may differ between the center @ and the side surface S3 in the x direction. When the symmetry in the x direction is also broken, a larger spin current is generated in the spin-orbit torque wiring 20, and the reversal current density required for the magnetization reversal of the first ferromagnetic layer 1 can be reduced. Here, an example in which the concentration of oxygen or nitrogen differs in the x direction has been shown, but the concentration of oxygen or nitrogen may differ in the y direction.

An electrical resistivity of the spin-orbit torque wiring 20 is, for example, 1 mΩ·cm or more. Also, the electrical resistivity of the spin-orbit torque wiring 20 is, for example, 10 mΩ·cm or less. When the electrical resistivity of the spin-orbit torque wiring 20 is high, a high voltage can be applied to the spin-orbit torque wiring 20. When a potential of the spin-orbit torque wiring 20 becomes high, spins can be efficiently supplied from the spin-orbit torque wiring 20 to the first ferromagnetic layer 1. Further, since the spin-orbit torque wiring 20 has at least a certain level of conductivity, a path of the electric current flowing along the spin-orbit torque wiring 20 can be secured, and the spin current due to the spin Hall effect can be efficiently generated.

A thickness of the spin-orbit torque wiring 20 is, for example, 4 nm or more. The thickness of the spin-orbit torque wiring 20 may be, for example, 20 nm or less.

The laminate 10 is connected to the spin-orbit torque wiring 20. For example, the laminate 10 is laminated on the spin-orbit torque wiring 20. Other layers may be provided between the laminate 10 and the spin-orbit torque wiring 20.

The resistance value of the laminate 10 in the z direction changes as spins are injected from the spin-orbit torque wiring 20 into the laminate 10 (first ferromagnetic layer 1).

The laminate 10 is interposed between the spin-orbit torque wiring 20 and the electrode E1 (see FIG. 2) in the z direction. The laminate 10 is a columnar body. A shape of the laminate 10 when viewed from above in the z direction is, for example, circular, elliptical, or quadrangular. For example, a side surface of the laminate 10 is inclined with respect to the z direction.

The laminate 10 includes, for example, the first ferromagnetic layer 1, a second ferromagnetic layer 2, and a nonmagnetic layer 3. The first ferromagnetic layer 1 is, for example, in contact with the spin-orbit torque wiring 20. The spin-orbit torque wiring 20 is, for example, laminated on the first ferromagnetic layer 1. Spins are injected into the first ferromagnetic layer 1 from the spin-orbit torque wiring 20. The magnetization of the first ferromagnetic layer 1 is subjected to the spin-orbit torque (SOT) due to the injected spins, and its orientation direction changes. The nonmagnetic layer 3 is interposed between the first ferromagnetic layer 1 and the second ferromagnetic layer 2 in the z direction.

The first ferromagnetic layer 1 and the second ferromagnetic layer 2 each have magnetization. An orientation direction of the magnetization of the second ferromagnetic layer 2 is less likely to change than the magnetization of the first ferromagnetic layer 1 when a predetermined external force is applied. The first ferromagnetic layer 1 is sometimes called a magnetization free layer, and the second ferromagnetic layer 2 is sometimes called a magnetization pinned layer or a magnetization reference layer. The laminate 10 shown in FIG. 3 has the magnetization pinned layer to be closer to the substrate Sub than the magnetization free layer, which is called a top pin structure. The resistance value of the laminate 10 changes depending on a difference in relative angle of magnetization between the first ferromagnetic layer 1 and the second ferromagnetic layer 2 between which the nonmagnetic layer 3 is interposed.

The first ferromagnetic layer 1 and the second ferromagnetic layer 2 contain a ferromagnetic material. The ferromagnetic material is, for example, a metal selected from the group consisting of Cr, Mn, Co, Fe, and Ni, an alloy containing one or more of these metals, an alloy containing these metals and at least one element of B, C, and N, or the like. The ferromagnetic material is, for example, Co—Fe, Co—Fe—B, Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. The Heusler alloy includes an intermetallic compound with a chemical composition of XYZ or $X_2YZ$. X is Co, Fe, Ni, or a transition metal element or noble metal element of the Cu group on the periodic table, Y is Mn, V, Cr or a transition metal of the Ti group or an elemental species of X, and Z is a typical element from Group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarizability.

The nonmagnetic layer 3 includes a nonmagnetic material. When the nonmagnetic layer 3 is an insulator (a tunnel barrier layer), $Al_2O_3$, $SiO_2$, MgO, $MgAl_2O_4$, and the like can be used for its material. Also, in addition to these materials, materials in which some of Al, Si, and Mg are replaced with Zn, Be, and the like can also be used. Among these, MgO and $MgAl_2O_4$ are materials that can realize coherent tunneling, and thus can efficiently inject spins. When the nonmagnetic layer 3 is made of a metal, Cu, Au, Ag, and the like can be used for its material. Further, when the nonmagnetic layer 3 is a semiconductor, Si, Ge, $CuInSe_2$, $CuGaSe_2$, Cu(In, Ga) $Se_2$, and the like can be used for its material.

The laminate 10 may include layers other than the first ferromagnetic layer 1, the second ferromagnetic layer 2, and the nonmagnetic layer 3. For example, an underlayer may be provided between the spin-orbit torque wiring 20 and the second ferromagnetic layer 2. The underlayer improves crystallinity of each layer constituting the laminate 10. Also, for example, a cap layer may be provided on the uppermost surface of the laminate 10.

Also, in the laminate 10, a ferromagnetic layer may be provided on a surface of the second ferromagnetic layer 2 on a side opposite to the nonmagnetic layer 3 with a spacer layer interposed therebetween. The second ferromagnetic layer 2, the spacer layer, and the ferromagnetic layer form a synthetic antiferromagnetic structure (SAF structure). A synthetic antiferromagnetic structure includes a nonmagnetic layer interposed between two magnetic layers. Antiferromagnetic coupling between the second ferromagnetic layer 2 and the ferromagnetic layer makes a coercive force of the second ferromagnetic layer 2 greater than that in the case without a ferromagnetic layer. The ferromagnetic layer is made of, for example, IrMn. PtMn, or the like. The spacer layer includes, for example, at least one selected from the group consisting of Ru, Ir, and Rh.

The electrode E1 is located to overlap the laminate 10 when viewed in the z direction. The electrode E1 is connected to the read wiring RL. The electrodes E2 and E3 are connected to the spin-orbit torque wiring 20 at positions at which the first ferromagnetic layer 1 is interposed therebetween when viewed in the z direction. The electrode E2 is connected to the write wiring WL, and the electrode E3 is connected to the common wiring CL. There may be other layers between the electrode E2 and the spin-orbit torque wiring 20 and between the electrode E3 and the spin-orbit torque wiring 20. The electrodes E1, E2, and E3 are, for example, conductors that electrically connect the switching elements to the magnetoresistive effect element 100. All of the electrodes E1, E2, and E3 are conductive.

The insulation layer 91 is located at the same level as the electrode E1. The insulation layer 92 is located at the same level as the laminate 10. The insulation layer 92 covers the side surface of the laminate 10. The insulation layer 93 is located at the same level as the spin-orbit torque wiring 20. The insulation layer 93 covers a side surface of the spin-orbit torque wiring 20. A combination of the insulation layer 92 and the insulation layer 93 is referred to as, for example, a first insulation layer. The insulation layer 94 is located at the same level as the electrodes E2 and E3. The insulation layer 94 is in contact with the second surface S2 of the spin-orbit torque wiring 20. The insulation layer 94 is referred to as, for example, a second insulation layer.

The first insulation layer and the second insulation layer are any of an oxide, a nitride, or an oxynitride. The first insulation layer and the second insulation layer contain the same material as the insulation layer 90 described above. The first insulation layer and the second insulation layer are common to the spin-orbit torque wiring 20 in that they are made of any of an oxide, a nitride, or an oxynitride, but are different from the spin-orbit torque wiring 20 in that they have insulation properties.

The first insulation layer may contain a metal element included in the spin-orbit torque wiring. Also, the second insulation layer may contain a metal element constituting the spin-orbit torque wiring. For example, when the insulation layer 94 and the spin-orbit torque wiring 20 are made of the same material and have different conduction properties due to a difference between their composition ratios, the insulation layer 94 and the spin-orbit torque wiring 20 can be formed simultaneously while changing their composition ratios.

Next, a method for manufacturing the magnetoresistive effect element 100 will be described. The magnetoresistive effect element 100 is formed through a process of laminating each layer and a process of processing a part of each layer into a predetermined shape. For the lamination of each layer, a sputtering method, a chemical vapor deposition (CVD) method, an electron beam evaporation method (EB evaporation method), an atomic laser deposition method, or the like can be used. The processing of each layer can be performed using photolithography or the like.

First, impurities are doped at predetermined positions on the substrate Sub to form the sources S and the drains D. Next, the gate insulation films GI and the gate electrodes G are formed between the sources S and the drains D. The sources S, the drains D, the gate insulation films GI, and the gate electrodes G become the transistors Tr. For the substrate Sub, a commercially available semiconductor circuit board on which the transistors Tr are formed may be used.

Next, a part of the insulation layer 90 is formed to cover the transistors Tr. Then, the electrode E1 is formed on the insulation layer 90, and its periphery is filled with the insulation layer 91. The write wiring WL and the common wiring CL are formed by laminating the insulation layer 90 to a predetermined thickness, forming grooves in the insulation layer 90, and filling the grooves with a conductor.

Next, a ferromagnetic layer, a nonmagnetic layer, a ferromagnetic layer, and a hard mask layer are laminated in order on one surface of the insulation layer 91 and the electrode E1. Next, the hard mask layer is processed into a predetermined shape. The predetermined shape is, for example, an outer shape of the laminate 10. The ferromagnetic layer, the nonmagnetic layer, and the ferromagnetic layer are processed through the hard mask layer to obtain the second ferromagnetic layer 2, the nonmagnetic layer 3, and the first ferromagnetic layer 1. Then, a periphery of the laminate 10 is filled with the insulation layer 92.

Next, a layer serving as the spin-orbit torque wiring 20 and a hard mask layer are deposited in order. The layer serving as the spin-orbit torque wiring 20 is processed through the hard mask layer to obtain the spin-orbit torque wiring 20.

A periphery of the spin-orbit torque wiring 20 is filled with the insulation layer 93, and the electrodes E2 and E3 are formed. Through this procedure, the magnetoresistive effect element 100 is obtained. Since the spin-orbit torque wiring 20 has the amorphous structure, there is no need to heat the spin-orbit torque wiring 20 to crystallize it.

In the magnetoresistive effect element 100 according to the first embodiment, the spin-orbit torque wiring 20 has the amorphous structure made of any of a metal oxide, a metal nitride, or a metal oxynitride. For that reason, different bonding states between atoms are present in a mixed state in the spin-orbit torque wiring 20, and the symmetry within the spin-orbit torque wiring 20 is broken. For that reason, in the magnetoresistive effect element 100, a large amount of spin current is injected into the first ferromagnetic layer 1, and the reversal current density required for the magnetization reversal of the first ferromagnetic layer 1 is small.

Although an example of the magnetoresistive effect element 100 according to the first embodiment has been shown above, additions, omissions, substitutions, and other modifications of configurations are possible without departing from the gist of the present disclosure.

First Modified Example

Figure 5:
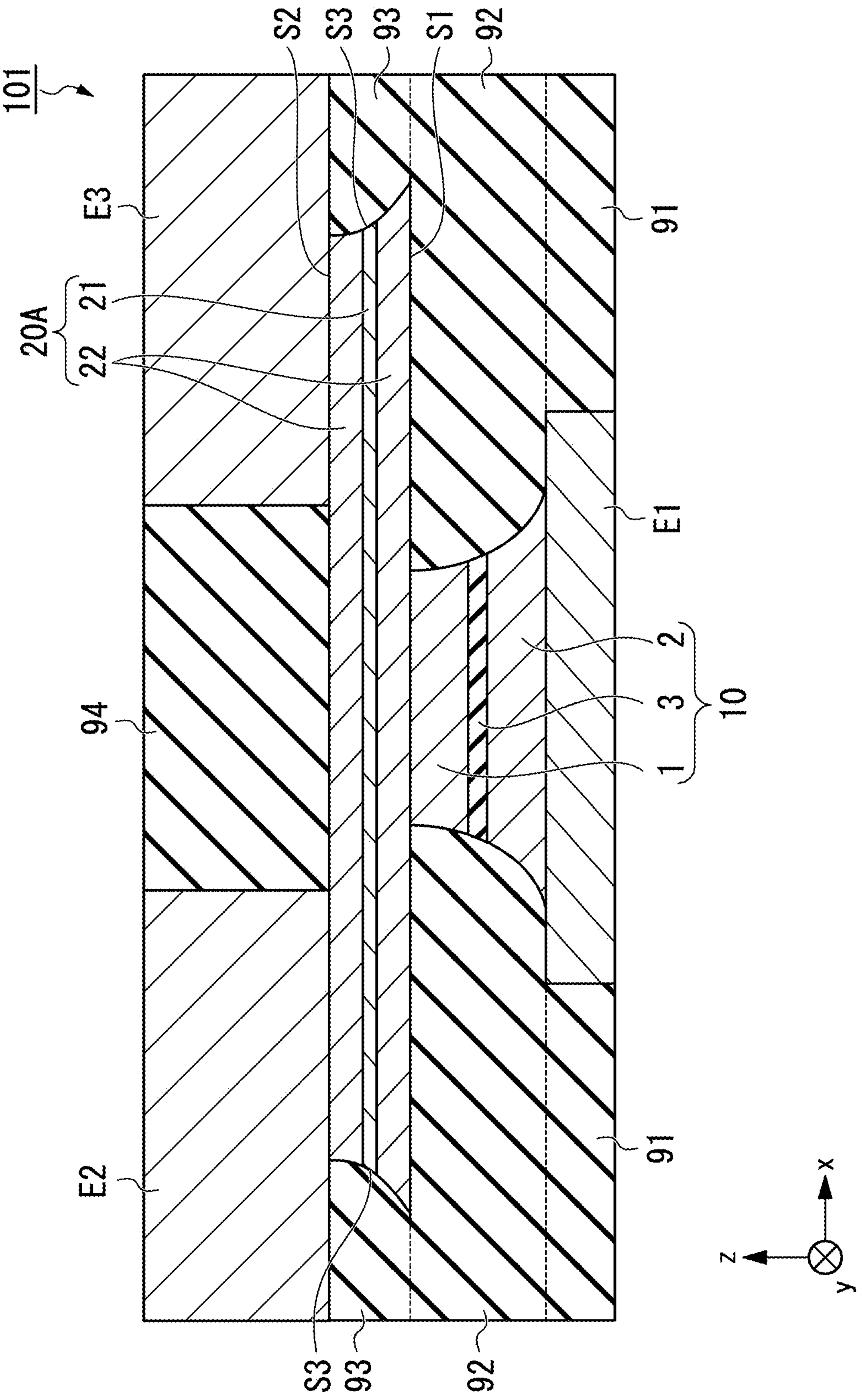
FIG. 5 is a cross-sectional view of a magnetoresistive effect element according to a first modified example.

FIG. 5 is a cross-sectional view of a magnetoresistive effect element 101 according to a first modified example. FIG. 5 is a xz cross-section passing through the center of the spin-orbit torque wiring 20A in the y direction. In FIG. 5, the same configurations as those in FIG. 3 will be denoted by the same reference numerals, and descriptions thereof will be omitted.

The magnetoresistive effect element 101 according to the first modified example is different from the magnetoresistive effect element 100 in the configuration of a spin-orbit torque wiring 20A.

The spin-orbit torque wiring 20A includes a crystallized layer 21 inside. The crystallized layer 21 is interposed between, for example, amorphous layers 22.

The crystallized layer 21 includes, for example, any one selected from the group consisting of Ta, Al, Mg. Si, Ga, and Ge. The crystallized layer 21 is preferably made of Ta, Al, or Mg. Ta, Al, and Mg are easy to crystallize. The amorphous layer 22 includes a material similar to the amorphous structure presented in the spin-orbit torque wiring 20 described above. The crystallized layer 21 can be formed by forming the amorphous layer 22 serving as an underlayer, depositing the above-described metal, and flash annealing it.

When the number of interfaces between different compositions increases inside the spin-orbit torque wiring 20A, an amount of spin injection from the spin-orbit torque wiring 20A to the first ferromagnetic layer 1 increases due to the Rashba effect.

The magnetoresistive effect element 101 according to the first modified example can obtain the same effects as the magnetoresistive effect element 100 according to the first embodiment.

Second Modified Example

Figure 6:
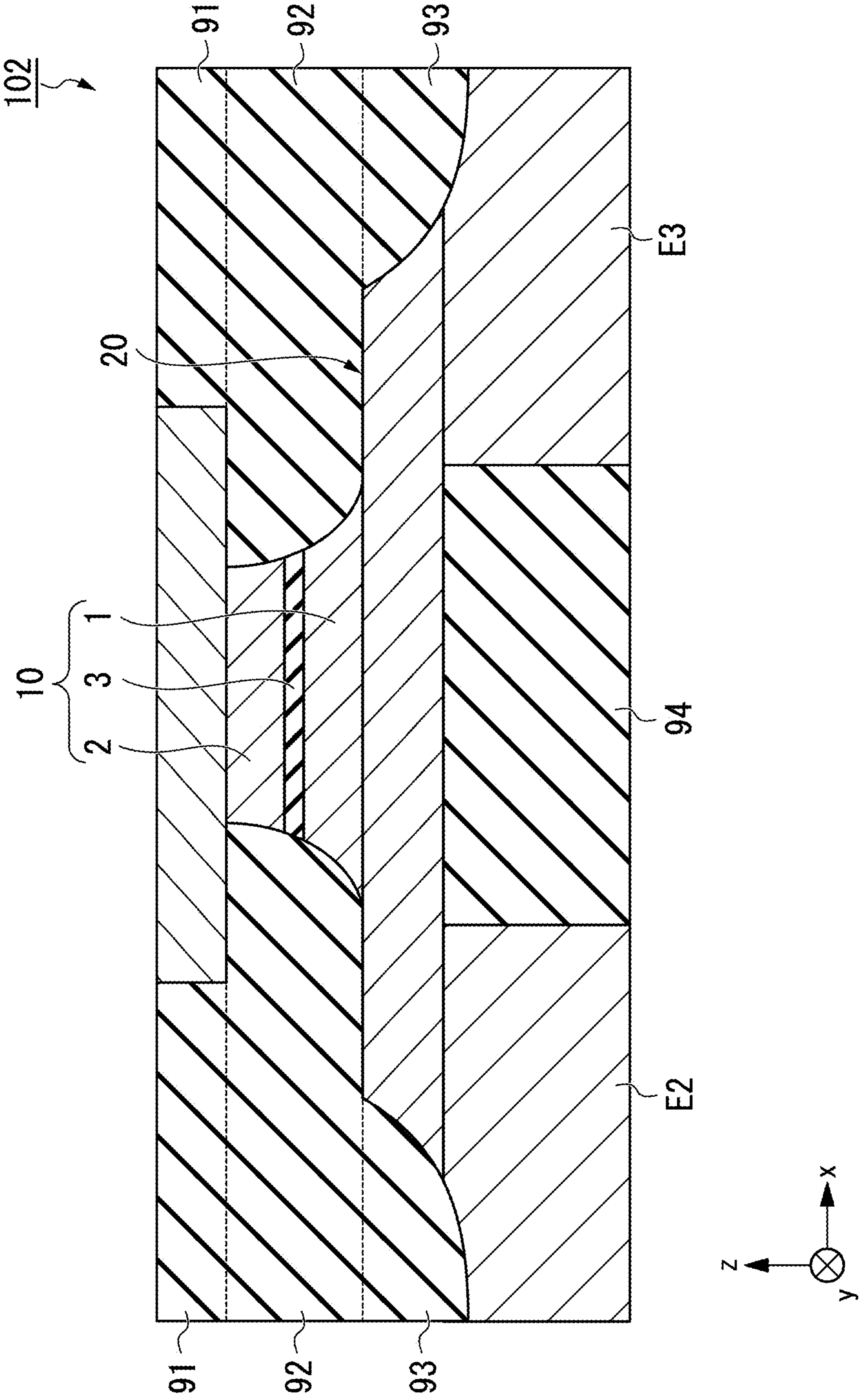
FIG. 6 is a cross-sectional view of a magnetoresistive effect element according to a second modified example.

FIG. 6 is a cross-sectional view of a magnetoresistive effect element 102 according to a second modified example. FIG. 6 is a xz cross-section passing through the center of the spin-orbit torque wiring 20 in the y direction. In FIG. 6, the same configurations as those in FIG. 3 will be denoted by the same reference numerals, and descriptions thereof will be omitted.

The laminate 10 shown in FIG. 6 has a top pin structure in which the magnetization pinned layer (second ferromagnetic layer 2) is located to be farther from the substrate Sub than the magnetization free layer (first ferromagnetic layer 1). The laminate 10 is located on the spin-orbit torque wiring 20. The spin-orbit torque wiring 20 is located on the electrodes E2 and E3.

The magnetoresistive effect element 102 according to the second modified example differs only in positional relationships between the respective configurations, and the same effects as those of the magnetoresistive effect element 100 according to the first embodiment can be obtained.

Second Embodiment

Figure 7:
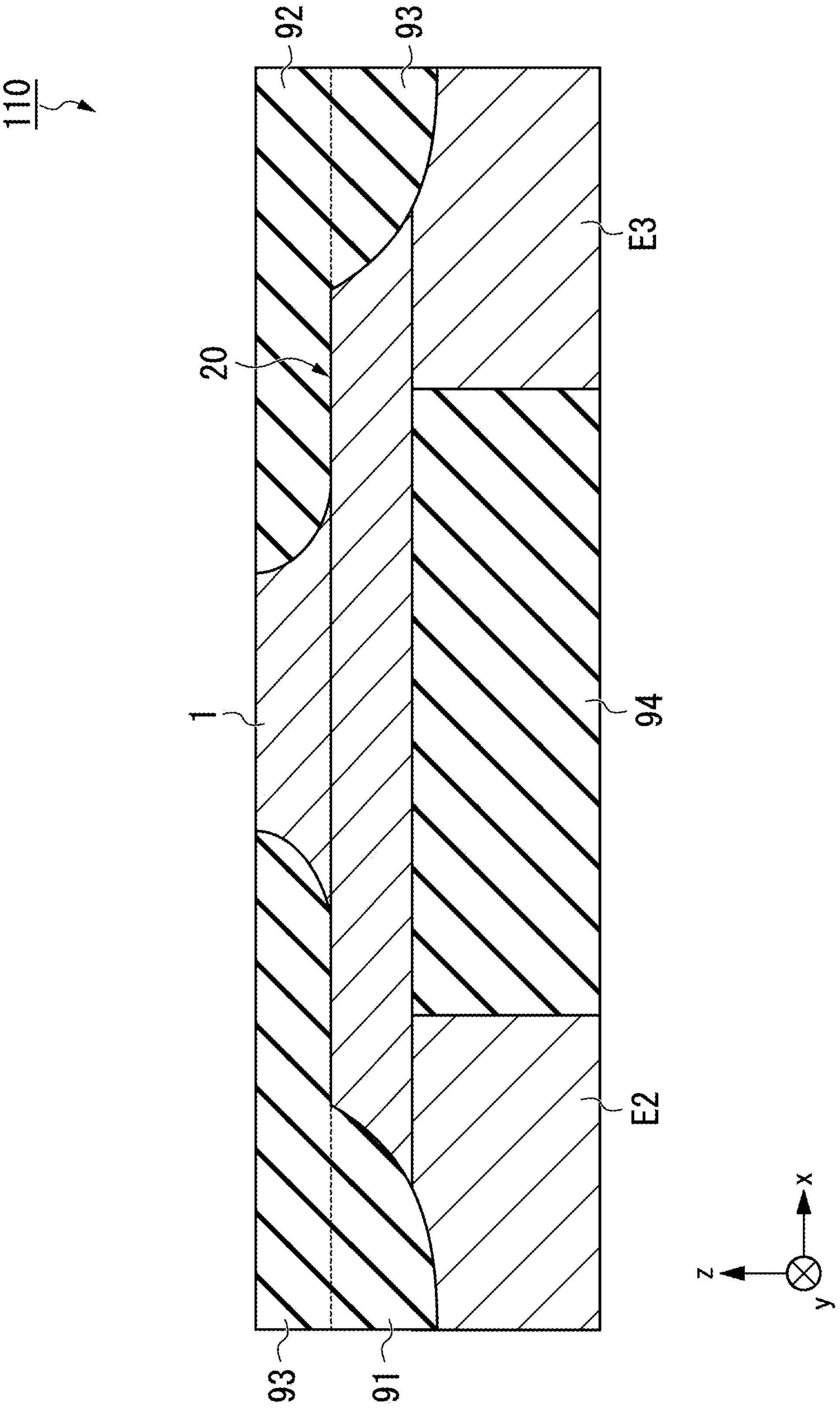
FIG. 7 is a cross-sectional view of a magnetization rotating element according to a second embodiment.

FIG. 7 is a cross-sectional view of a magnetization rotating element 110 according to a second embodiment. In FIG. 7, the magnetization rotating element 110 is replaced with the magnetoresistive effect element 100 according to the first embodiment.

For example, the magnetization rotating element 110 makes light incident on the first ferromagnetic layer 1 and evaluates light reflected by the first ferromagnetic layer 1. When an orientation direction of magnetization changes due to the magnetic Kerr effect, a polarization state of the reflected light changes. The magnetization rotating element 110 can be used, for example, as an optical element of an image display device or the like that utilizes a difference in polarization state of light.

In addition, the magnetization rotating element 110 can be used alone as an anisotropic magnetic sensor, an optical element using the magnetic Faraday effect, or the like.

The spin-orbit torque wiring 20 of the magnetization rotating element 110 includes an amorphous structure, and the amorphous structure is made of any of an oxide, a nitride, or an oxynitride.

In the magnetization rotating element 110 according to the second embodiment, only the nonmagnetic layer 3 and the second ferromagnetic layer 2 are removed from the magnetoresistive effect element 102, and the same effects as the magnetoresistive effect element 100 according to the first embodiment can be obtained.

Although the preferred aspects of the present disclosure have been illustrated above on the basis of the first embodiment, the second embodiment, and the modified examples, but the present disclosure is not limited thereto. For example, featured configurations of each of the embodiments and the modified examples may be adopted to other embodiments and modified examples.

REFERENCE SIGNS LIST

1 First ferromagnetic layer
2 Second ferromagnetic layer
3 Nonmagnetic layer
10 Laminate
20, 20A Spin-orbit torque wiring
21 Crystallized layer
22 Amorphous layer
90, 91, 92, 93, 94 Insulation layer
100, 101, 102 Magnetoresistive effect element
110 Magnetization rotating element
200 Magnetic memory
E1, E2, E3 Electrode
C Center
CL Common wiring
RL Read wiring
WL Write wiring
S1 First surface
S2 Second surface
S3 Side surface

What is claimed is:

1. A magnetization rotating element comprising:

a spin-orbit torque wiring; and a first ferromagnetic layer connected to the spin-orbit torque wiring, wherein the spin-orbit torque wiring has an amorphous structure, the amorphous structure is made of any of an oxide, a nitride, and an oxynitride, and a concentration of oxygen or nitrogen in a first surface of the spin-orbit torque wiring on a side closer to the first ferromagnetic layer is different from a concentration of oxygen or nitrogen in a second surface on a side opposite to the first surface.

2. The magnetization rotating element according to claim 1, wherein a concentration of oxygen or nitrogen contained in the spin-orbit torque wiring is lower than a concentration of oxygen or nitrogen of a stoichiometric composition determined from cations contained in the spin-orbit torque wiring.

3. The magnetization rotating element according to claim 1, wherein the spin-orbit torque wiring includes an element including d electrons or f electrons.

4. The magnetization rotating element according to claim 1, wherein the concentration of oxygen or nitrogen in the second surface is higher than the concentration of oxygen or nitrogen in the first surface.

5. The magnetization rotating element according to claim 4, wherein the concentration of oxygen or nitrogen gradually decreases from the second surface toward the first surface.

6. The magnetization rotating element according to claim 1, wherein the concentration of oxygen or nitrogen is maximum or minimum between the second surface and the first surface.

7. The magnetization rotating element according to claim 1, wherein a concentration of oxygen or nitrogen in the spin-orbit torque wiring differs between a center and a side in any in-plane direction.

8. The magnetization rotating element according to claim 1 further comprising a first insulation layer that covers side surfaces of the first ferromagnetic layer and the spin-orbit torque wiring, wherein the first insulation layer is made of any of an oxide, a nitride, and an oxynitride.

9. The magnetization rotating element according to claim 1 further comprising a second insulation layer that covers a second surface of the spin-orbit torque wiring on a side opposite to a first surface closer to the first ferromagnetic layer, wherein the second insulation layer is made of any of an oxide, a nitride, and an oxynitride.

10. The magnetization rotating element according to claim 9, wherein the second insulation layer includes a metal element included in the spin-orbit torque wiring.

11. A magnetoresistive effect element comprising:

the magnetization rotating element according to claim 1;

a second ferromagnetic layer; and a nonmagnetic layer, wherein the nonmagnetic layer is interposed between the first ferromagnetic layer and the second ferromagnetic layer.

12. A magnetic memory comprising a plurality of magnetoresistive effect elements according to claim 11.

13. A magnetization rotating element comprising, a spin-orbit torque wiring; and a first ferromagnetic layer connected to the spin-orbit torque wiring;

wherein the spin-orbit torque wiring has an amorphous structure, the amorphous structure is made of any of an oxide, a nitride, and an oxynitride, and the spin-orbit torque wiring includes a crystallized layer inside.

14. The magnetization rotating element according to claim 13, wherein the crystallized layer contains any one selected from the group consisting of Ta, Al, Mg, Si, Ga, and Ge.

* * * * *